United States Patent
Zhang et al.

(10) Patent No.: US 9,786,551 B2
(45) Date of Patent: Oct. 10, 2017

(54) TRENCH STRUCTURE FOR HIGH PERFORMANCE INTERCONNECTION LINES OF DIFFERENT RESISTIVITY AND METHOD OF MAKING SAME

(71) Applicants: STMicroelectronics, Inc., Coppell, TX (US); International Business Machines Corporation, Armonk, NY (US)

(72) Inventors: John Hongguang Zhang, Altamont, NY (US); Lawrence A. Clevenger, LaGrangeville, NY (US); Carl Radens, LaGrangeville, NY (US); Yiheng Xu, Hopewell Junction, NY (US); Richard Stephen Wise, Ridgefield, CT (US)

(73) Assignees: STMICROELECTRONICS, INC., Coppell, TX (US); INTERNATIONAL BUSINESS MACHINES CORPORATION, Armonk, NY (US)

(*) Notice: Subject to any disclaimer, the term of this patent is extended or adjusted under 35 U.S.C. 154(b) by 215 days.

(21) Appl. No.: 14/264,803

(22) Filed: Apr. 29, 2014

(65) Prior Publication Data
US 2015/0311113 A1 Oct. 29, 2015

(51) Int. Cl.
| H01L 21/4763 | (2006.01) |
| H01L 21/768 | (2006.01) |
| H01L 23/528 | (2006.01) |
| H01L 21/033 | (2006.01) |
| H01L 21/311 | (2006.01) |
| H01L 23/522 | (2006.01) |

(52) U.S. Cl.
CPC .... *H01L 21/76816* (2013.01); *H01L 21/0337* (2013.01); *H01L 21/31144* (2013.01); *H01L 23/5283* (2013.01); *H01L 23/5228* (2013.01); *H01L 2924/0002* (2013.01)

(58) Field of Classification Search
CPC .................................... H01L 21/76802
USPC ..................................... 438/637, 618
See application file for complete search history.

(56) References Cited

U.S. PATENT DOCUMENTS 7,470,630 B1* 12/2008 Chen .................. H01L 21/3212
257/752
7,772,632 B2* 8/2010 Haller .................. G11C 11/405
257/296

(Continued)

*Primary Examiner* — Igwe U Anya
(74) *Attorney, Agent, or Firm* — Gardere Wynne Sewell LLP

(57) ABSTRACT

An integrated circuit includes a substrate with an interlevel dielectric layer positioned above the substrate. First trenches having a first depth are formed in the interlevel dielectric layer and a metal material fills the first trenches to form first interconnection lines. Second trenches having a second depth are also formed in the interlevel dielectric layer and filled with a metal material to form second interconnection lines. The first and second interconnection lines have a substantially equal pitch, which in a preferred implementation is a sub-lithographic pitch, and different resistivities due to the difference in trench depth. The first and second trenches are formed with an etching process through a hard mask having corresponding first and second openings of different depths. A sidewall image transfer process is used to define sub-lithographic structures for forming the first and second openings in the hard mask.

23 Claims, 15 Drawing Sheets

(56) References Cited

U.S. PATENT DOCUMENTS

| | | |
|---|---|---|
| 8,455,364 B2 | 6/2013 | Kanakasabapathy |
| 8,673,165 B2 | 3/2014 | Raghunathan et al. |
| 2002/0081854 A1* | 6/2002 | Morrow ............ H01L 21/31144 438/694 |
| 2006/0197228 A1* | 9/2006 | Daubenspeck ......... G03F 1/144 257/773 |
| 2007/0138535 A1* | 6/2007 | Higashitani ........... H01L 27/115 257/315 |
| 2007/0249174 A1* | 10/2007 | Yang .................. H01L 21/0334 438/712 |
| 2009/0080229 A1* | 3/2009 | Chandra Sekar .. G11C 16/0483 365/63 |
| 2011/0189438 A1* | 8/2011 | Furusho .................. B29C 33/40 428/156 |
| 2011/0223734 A1* | 9/2011 | Davis .................. H01L 21/3065 438/296 |
| 2012/0069669 A1* | 3/2012 | Sakamoto .......... G11C 16/0466 365/185.18 |
| 2012/0225546 A1* | 9/2012 | Kamiya ............ H01L 27/11546 438/591 |
| 2012/0309189 A1* | 12/2012 | Park .................. H01L 21/31144 438/643 |
| 2013/0023119 A1* | 1/2013 | Park .................. H01L 21/76808 438/675 |
| 2014/0057436 A1 | 2/2014 | Chen et al. |

* cited by examiner

TRENCH STRUCTURE FOR HIGH PERFORMANCE INTERCONNECTION LINES OF DIFFERENT RESISTIVITY AND METHOD OF MAKING SAME

FIELD OF THE INVENTION

The present disclosure generally relates to interconnection structures such as lines formed in metallization layers of integrated circuits and in particular to a method for forming such interconnection structures with a high integration density.

BACKGROUND

Reference is made to FIGS. 1A-1E which generally illustrate the process steps associated with the sidewall image transfer (SIT) manufacturing process (also referred to as sidewall image patterning (SIP) by those skilled in the art). Sidewall image processing is a technique which permits the production of sub-resolution features for integrated circuits. The process starts in FIG. 1A with a substrate 10. The substrate 10 may comprise any substrate as known to those skilled in the art and may include many layers, structures and components (not shown). The substrate 10 has a planar top surface 12 which may, for example, be obtained by chemical mechanical polishing (CMP) of an upper-most layer of the substrate 10. A patterned resist image 14 is then formed on the top surface 12 of the substrate 10 (FIG. 1B). The pitch 13 of the image 14 is constrained by the lithographic limits of the patterning process. A conformal coating 16 is then formed over the resist image 14 (FIG. 1C). The coating 16 may, for example, comprise an oxide material such as silicon dioxide. A highly directional etch is then used to remove the planar areas of the coating 16 so as to leave sidewalls (also referred to as collars) 18 of the coating material on either side of the features 20 of the patterned resist image 14 (FIG. 1D). Another etch is then performed to remove the features 20 (FIG. 1E). As can be seen, the advantage of this process is the ability to form very narrow lines with well-controlled widths, and thus produce a feature pitch 15 which is smaller than the pitch 13 of the lithographic process. Using an additional lithographic mask and etch, the structure shown in FIG. 1E may be trimmed to remove unwanted closed loops formed by the encircling pattern of the sidewalls 18 and thus form lines. The resulting line width is limited by the verticality of the original resist image features 20, the accuracy of the conformal coating 16 and the directionality of the coating etch. In a preferred implementation, the parameters of the process are controlled so that the pitch 15 of the sidewall pattern (FIG. 1E) is one-half the pitch 15 of the resist pattern (FIG. 1B).

As technology nodes continue to scale down beyond 20 nm, the requirement for obtaining different resistivity interconnections with high integration density has become extremely challenging. A current solution known to those skilled in the art is to use a different trench critical dimension (CD) at the same metallization level in order to form different resistivity interconnection lines. This solution has a drawback in that it requires a large integration area.

There is accordingly a need in the art for an improved method for forming interconnection lines with different resistivities while maintaining a constant line pitch. It would be preferred if the process did not introduce or require the use of an additional hard mask and etch.

SUMMARY

In an embodiment, an integrated circuit comprises: a substrate; an interlevel dielectric layer above the substrate; a first plurality of trenches having a first depth in the interlevel dielectric layer; a metal material filling the first plurality of trenches to form first interconnection lines; a second plurality of trenches having a second depth in the interlevel dielectric layer; a metal material filling the second plurality of trenches to form second interconnection lines; and wherein the first and second interconnection lines have a substantially equal pitch.

In an embodiment, a method comprises: forming an interlevel dielectric layer over a substrate; forming a first plurality of trenches having a first depth in the interlevel dielectric layer; forming a second plurality of trenches having a second depth in the interlevel dielectric layer; and depositing a metal material filling both the first plurality of trenches and the second plurality of trenches so as to form first interconnection lines within the first plurality of trenches and second interconnection lines within the second plurality of trenches; wherein the first and second interconnection lines have a substantially equal pitch.

In an embodiment, a method comprises: forming an interlevel dielectric layer over a substrate; forming a hard mask on a top planar surface of the interlevel dielectric layer; forming openings in the hard mask including a first plurality of openings having a first depth which does not extend through the hard mask and a second plurality of openings having a second depth which does not extend through the hard mask but which is smaller than the first depth; performing a directional etch simultaneously through the first and second pluralities of openings in the hard mask to etch through the hard mask and into the interlevel dielectric layer so as to form first and second pluralities of trenches, wherein the first plurality of trenches has a first trench depth and the second plurality of trenches has a second trench depth which is smaller than the first trench depth; and filling the first and second pluralities of trenches with a metal material to form first and second interconnection lines having a substantially equal pitch.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE DRAWINGS

Figure 2:
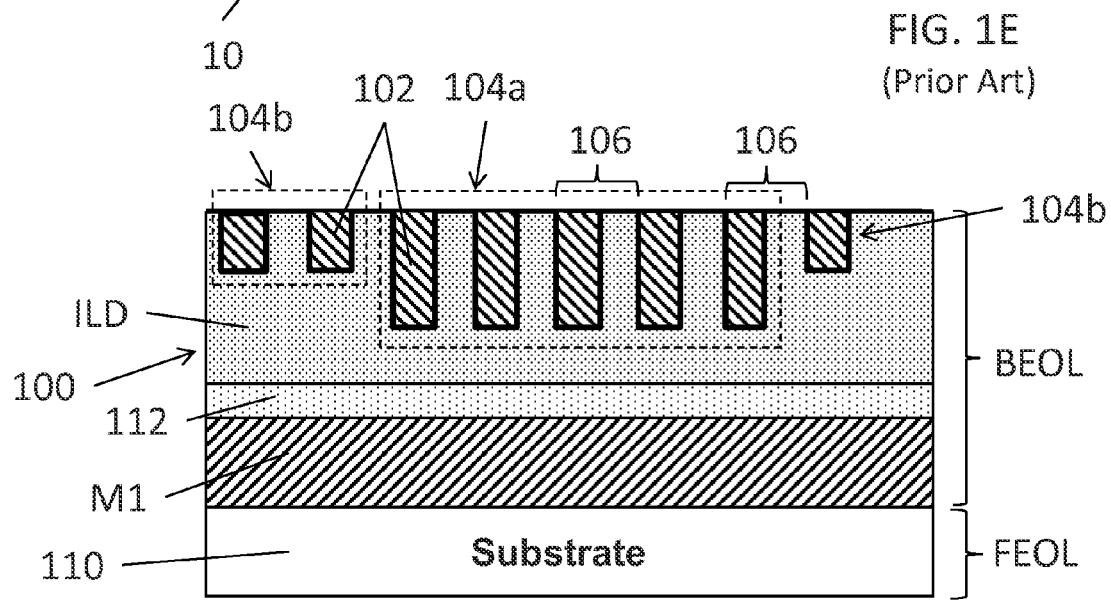
FIG. 2 is a cross-section of an integrated circuit which includes interconnection lines having different resistivities while maintaining a constant line pitch.

Reference is now made to FIG. 2 which illustrates a cross-section of an integrated circuit 100 that includes interconnection lines 102 having different resistivities while maintaining a constant line pitch 106 between all lines regardless of resistivity. The integrated circuit 100 includes a substrate 110. The substrate 110 may comprise any substrate as known to those skilled in the art and may include many layers, structures and components (not shown). In an exemplary implementation, the uppermost layer of the substrate 110 comprises a premetal dielectric (PMD) layer as known to those skilled in art with the contacts, gate structures, semiconductor substrate, and other structures known to those skilled in the art for front end of line (FEOL) integrated circuit fabrication underlying the premetal dielectric layer and comprising parts of the substrate 110. More generally, the substrate 110 may be considered to comprise all parts of the wafer located below a given metallization layer.

With respect to back end of line (BEOL) structures, a first metallization layer (M1) overlies the substrate 110. A dielectric cap layer 112, such as an NBLoK (nitrogen-doped silicon carbide) layer, overlies the first metallization layer M1. The BEOL structures further include an interlevel dielectric (ILD) layer. Formed within the ILD layer are a number of conducting interconnection lines 102. It will be noted that the lines 102 have different depths. A deeper line depth is used for an interconnection line 102 requiring a lower resistivity connection and the circuit includes a plurality of low resistivity lines 104a. A shallower line depth is used for an interconnection line 102 requiring a higher resistivity connection and the circuit includes a plurality of high resistivity lines 104b. The lines 102 exhibit a same pitch 106 relative to each other regardless of depth and resistivity. In a preferred embodiment, the pitch 106 is a sub-lithographic pitch.

Although the interconnection lines are shown as formed within the ILD layer residing immediately above the first metallization layer M1, it will be understood that the interconnection lines can be formed in any interlevel dielectric (ILD) layer of a multi-layer interconnect structure of the BEOL structure. The illustration relative to the first metallization layer M1 is exemplary only.

Figure 3A:
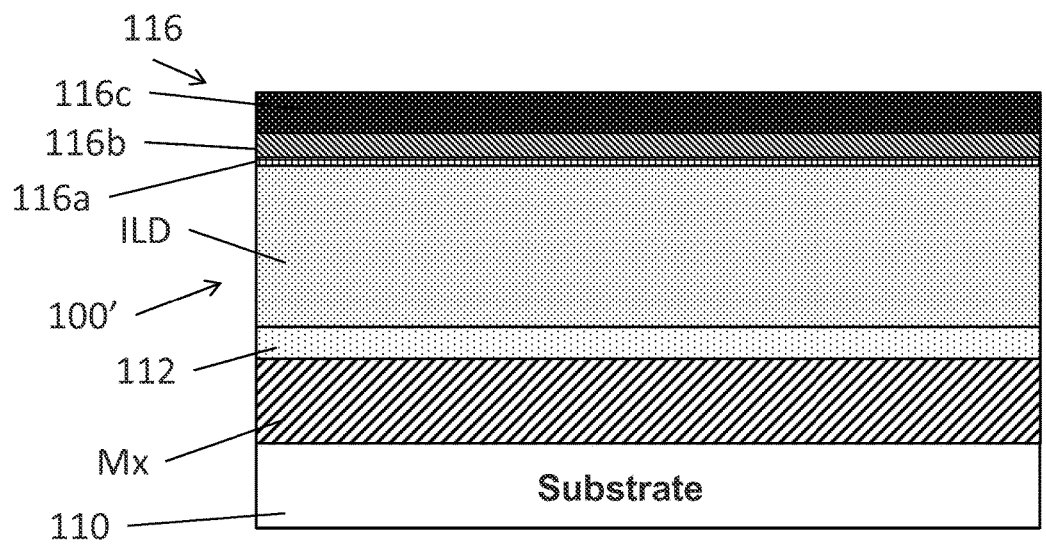
FIGS. 3A-3Q illustrate process steps for forming the structure of FIG. 2.
Figure 3B:
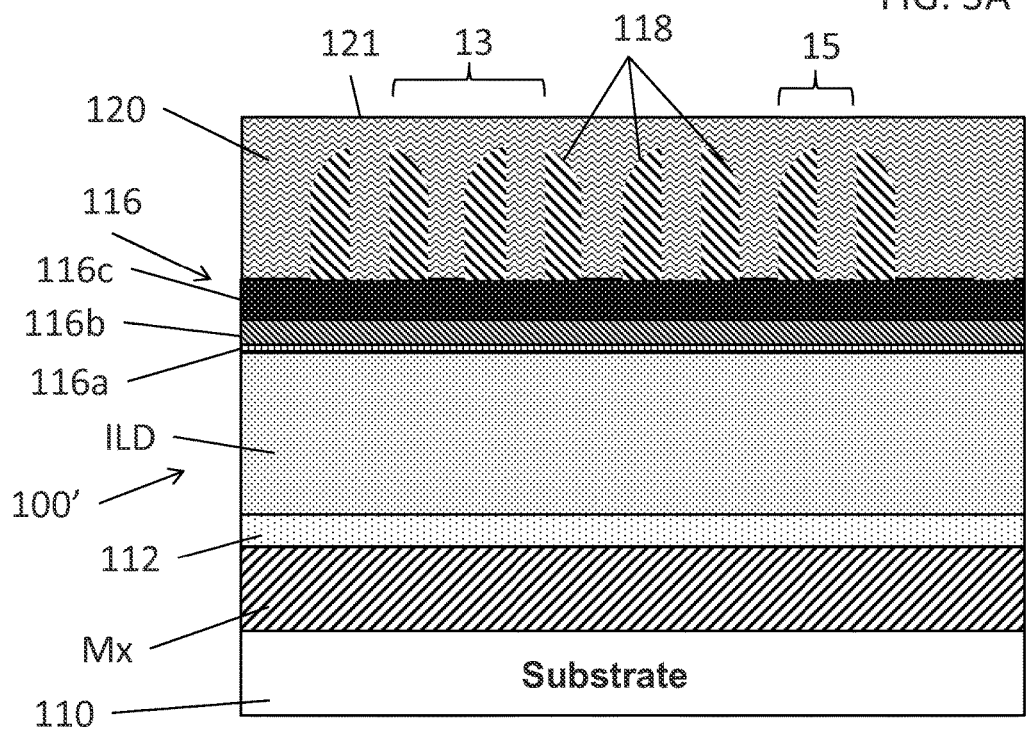
Figure 3C:
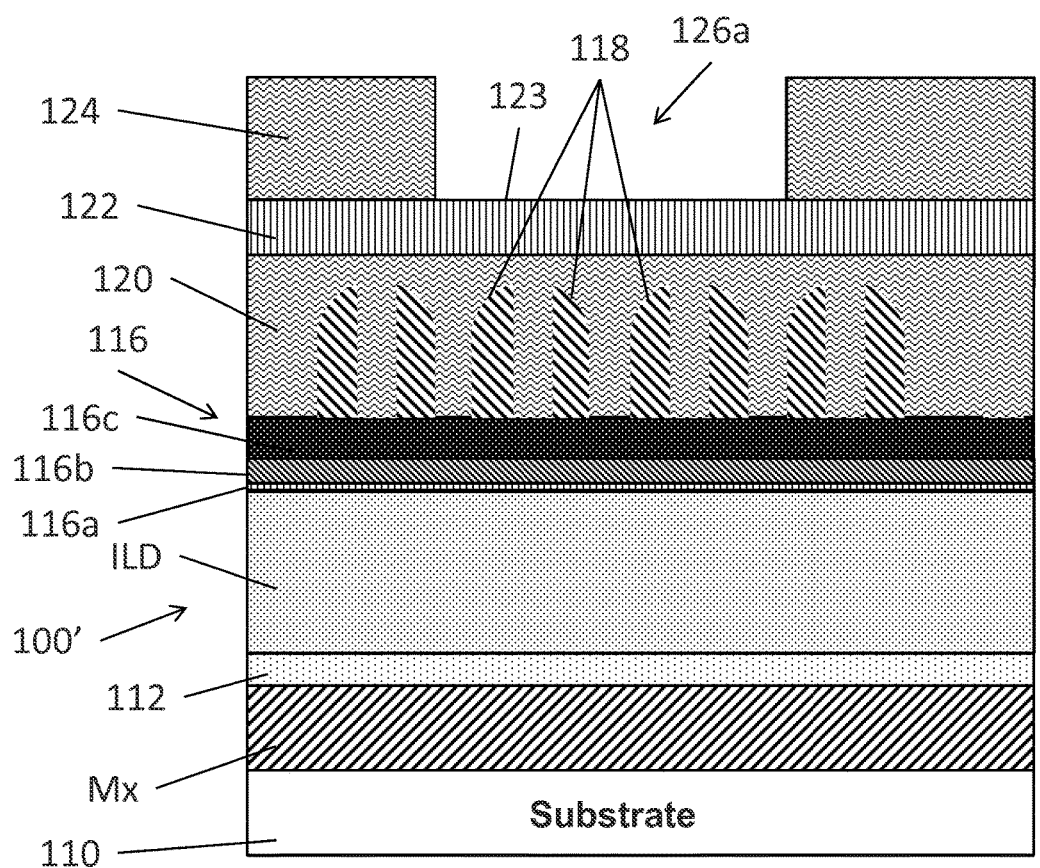
Figure 3D:
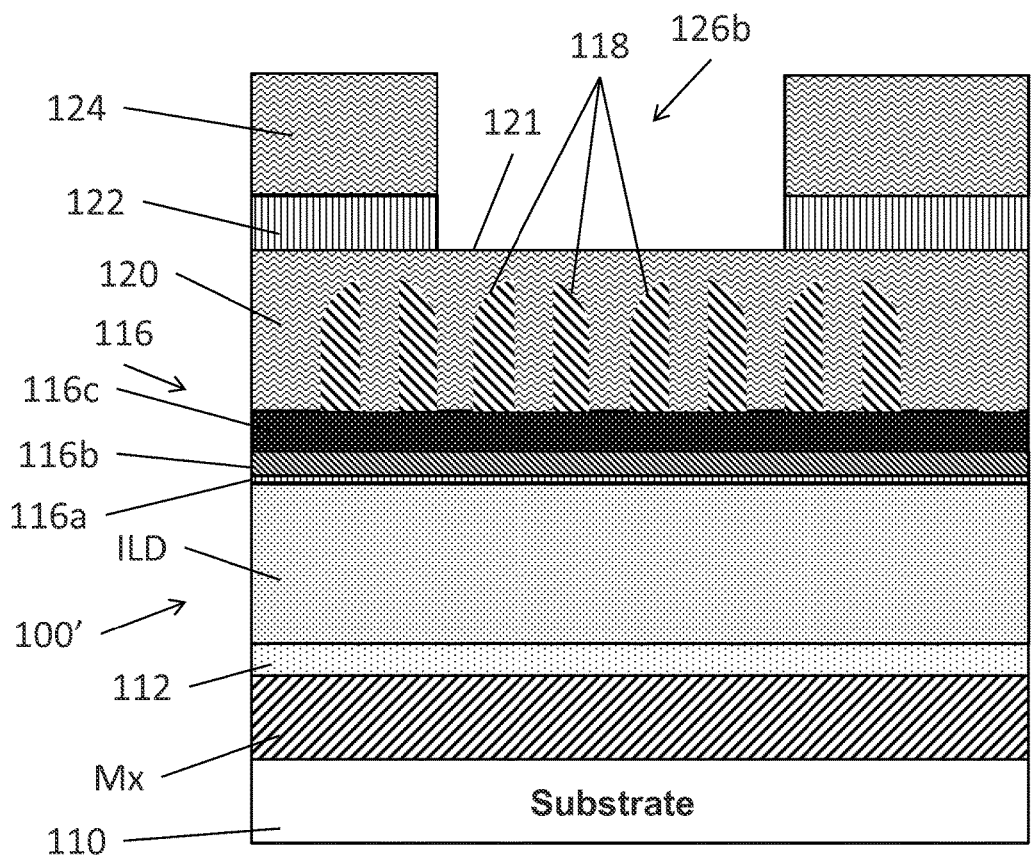
Figure 3E:
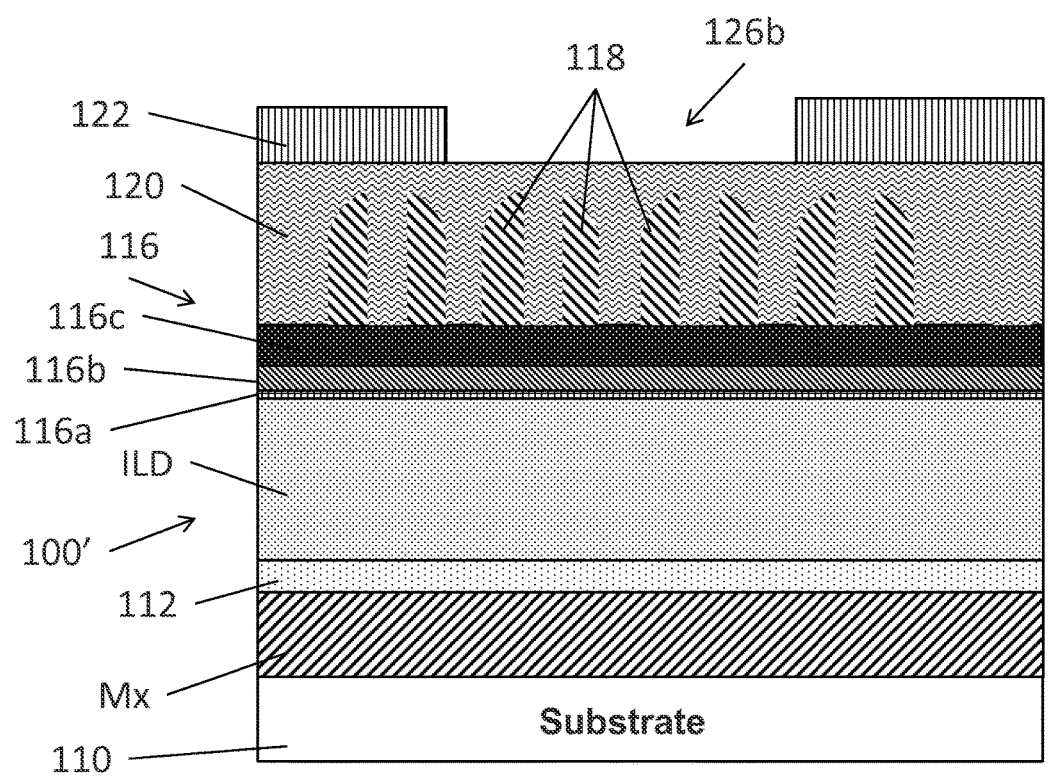
Figure 3F:
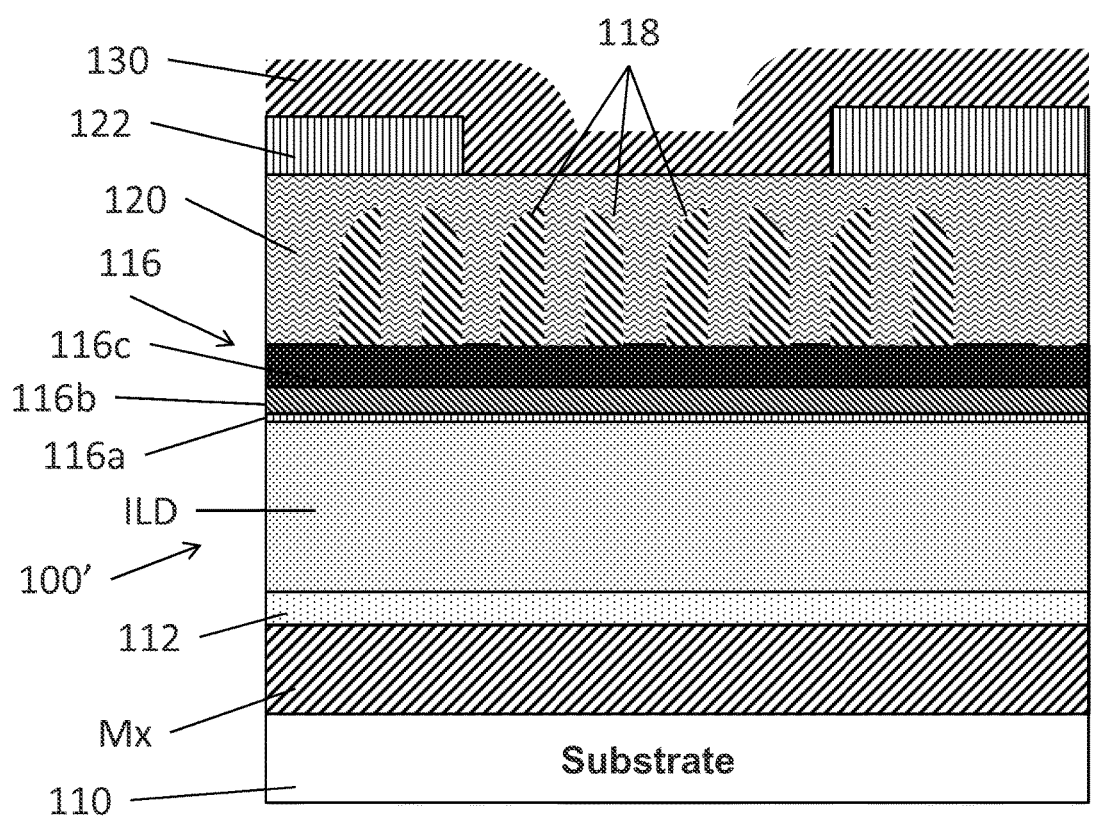
Figure 3G:
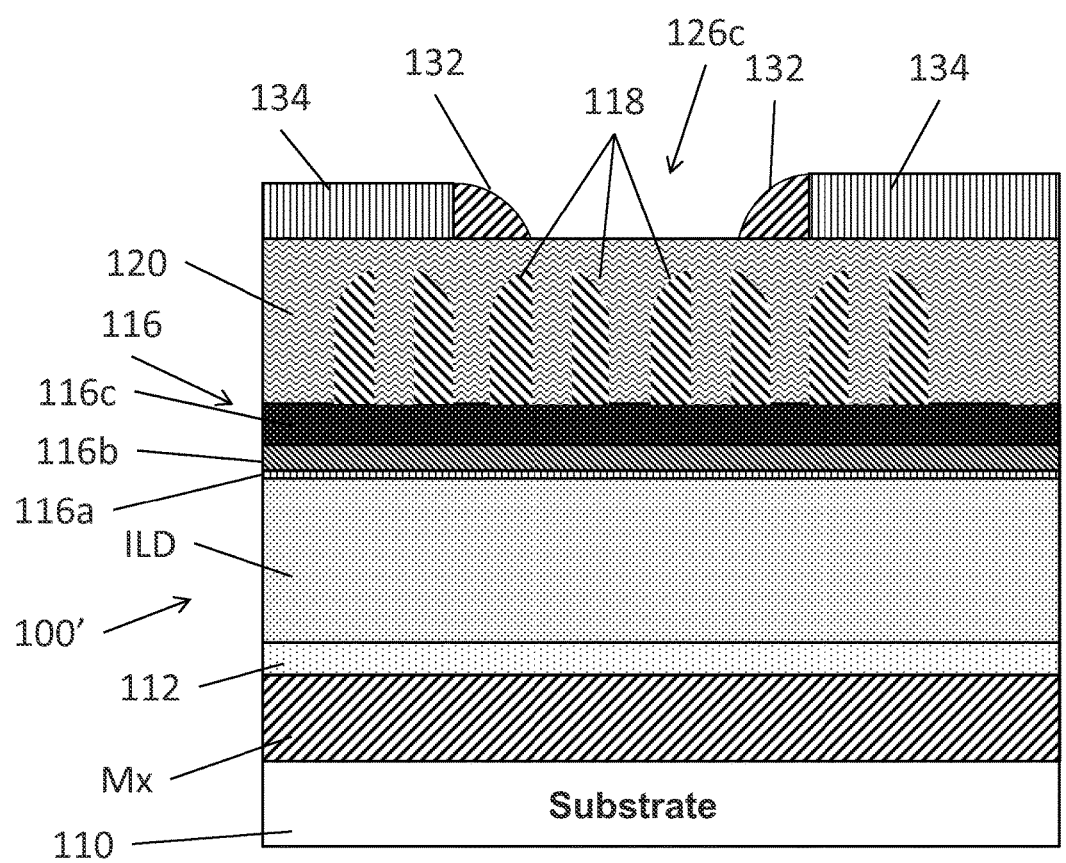
Figure 3H:
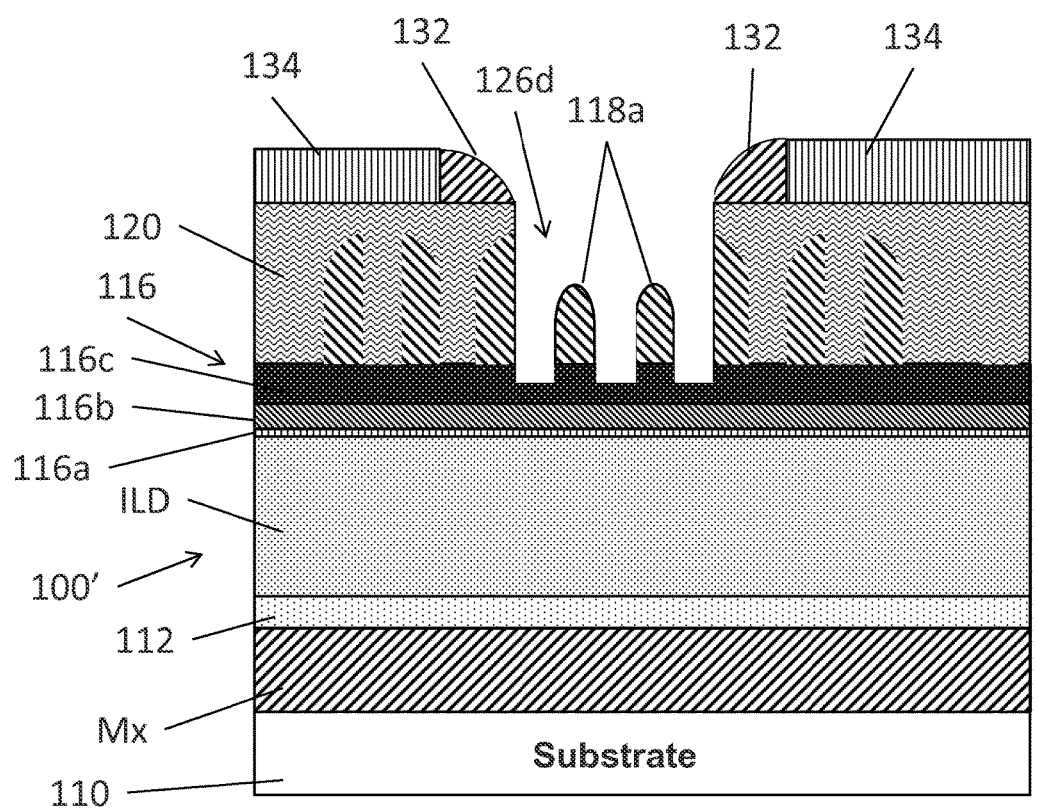
Figure 3I:
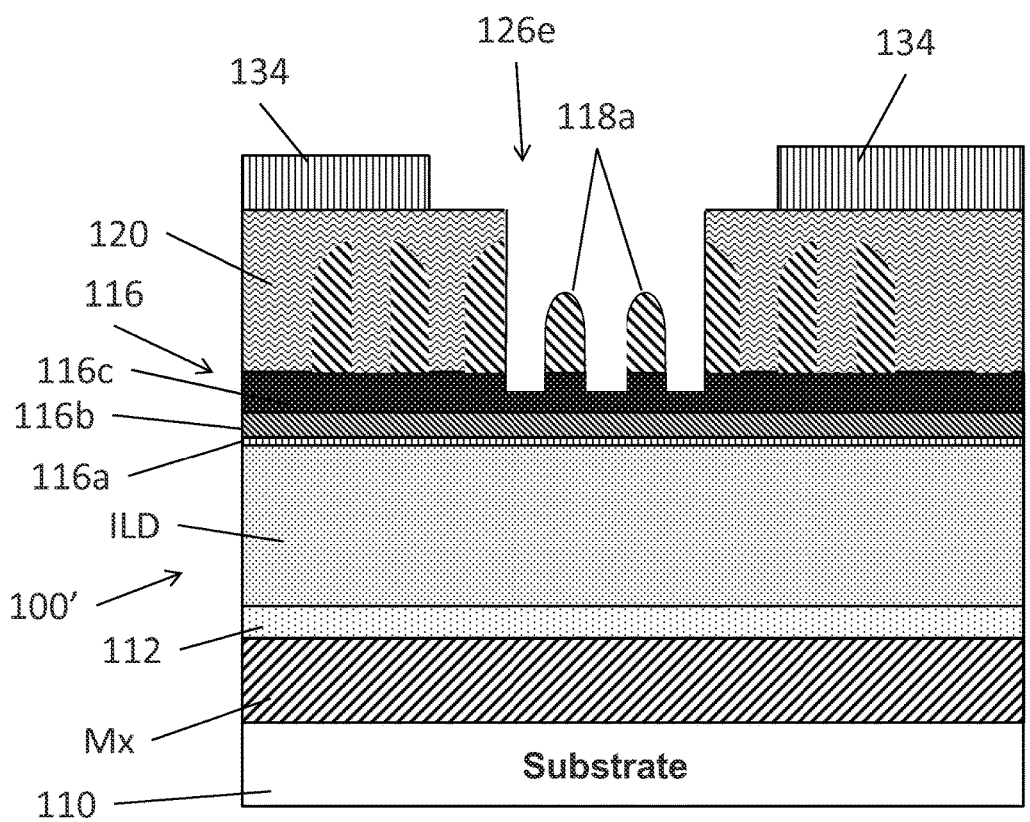
Figure 3J:
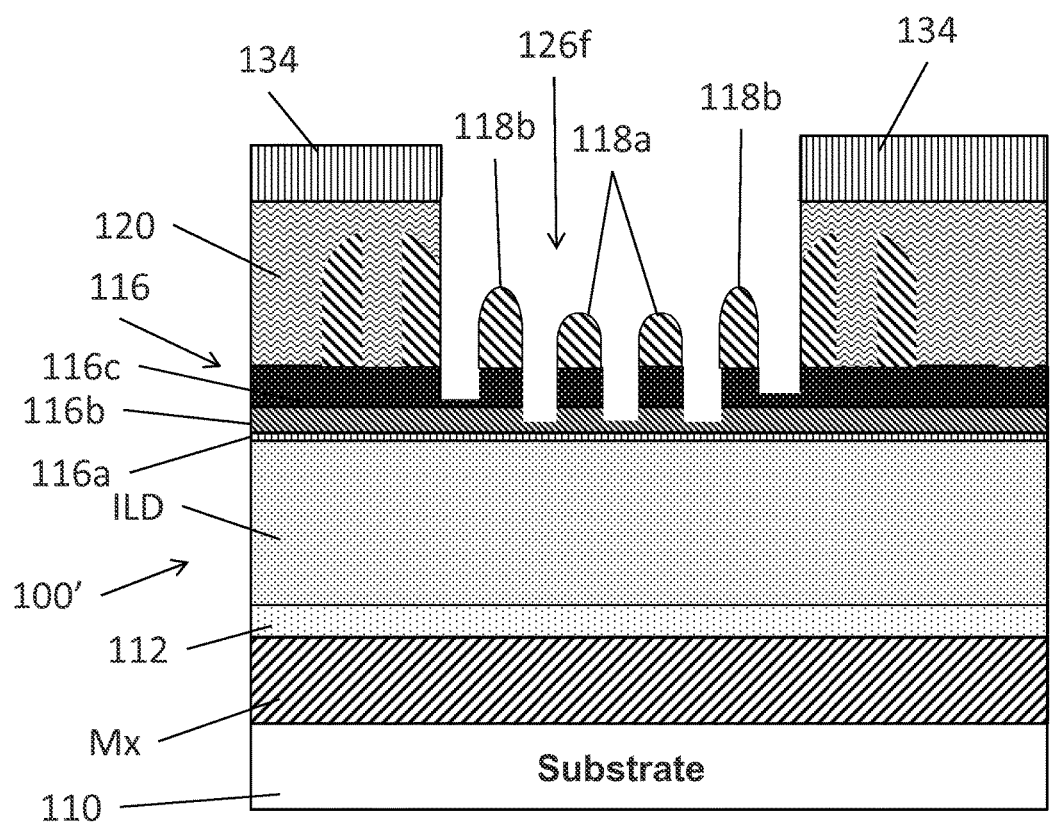
Figure 3K:
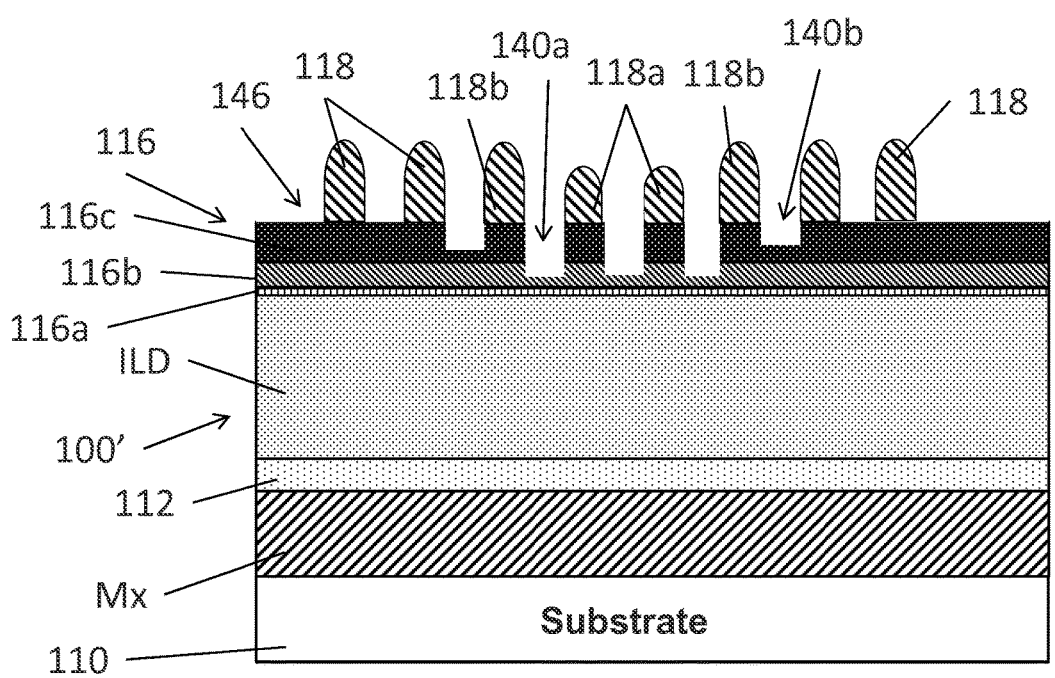
Figure 3L:
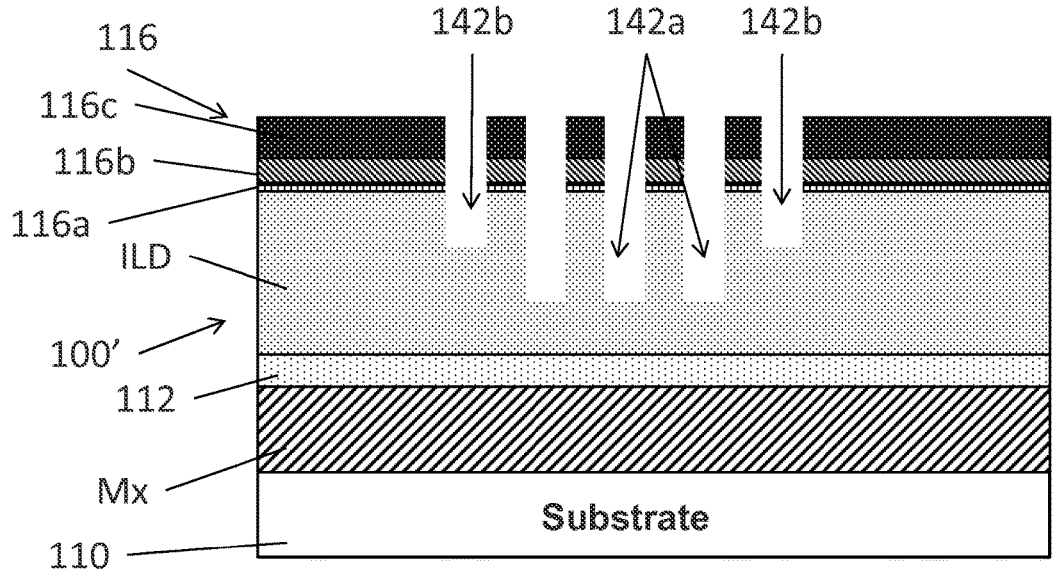
Figure 3M:
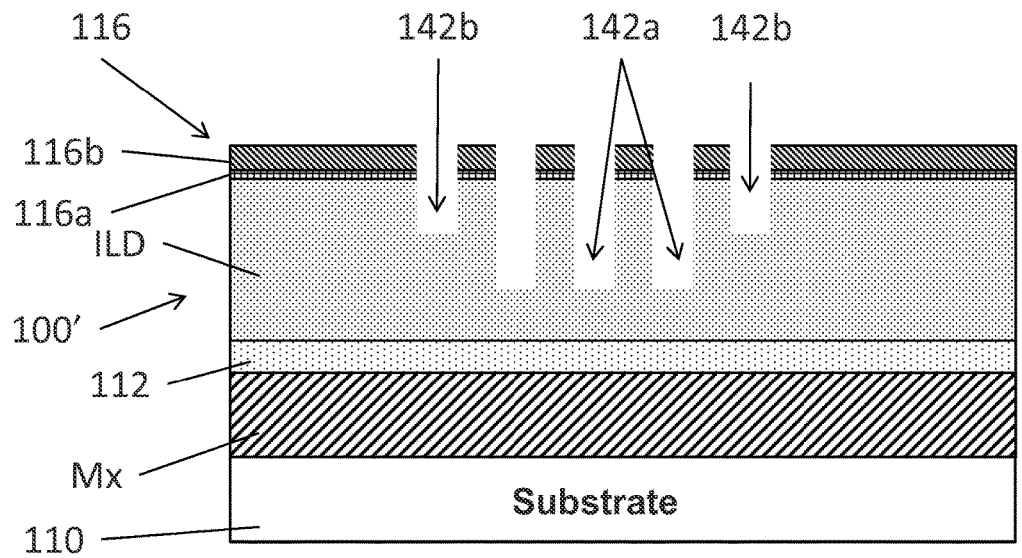
Figure 3N:
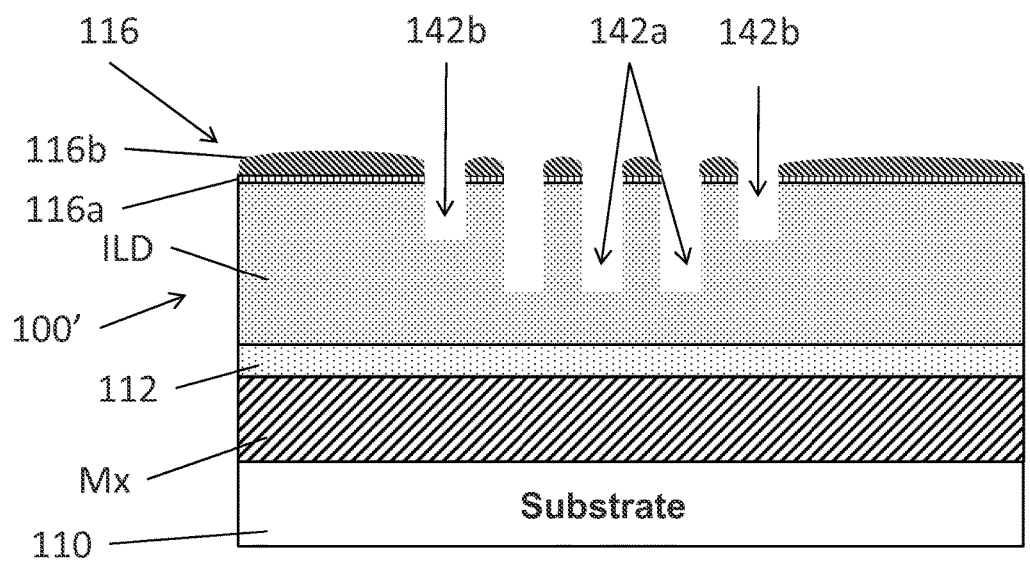
Figure 3O:
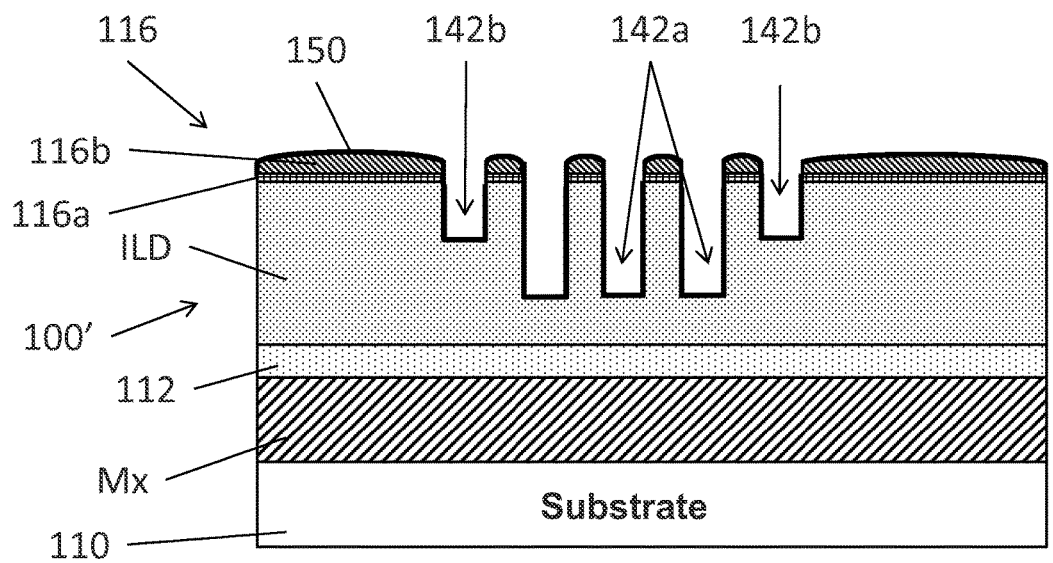
Figure 3P:
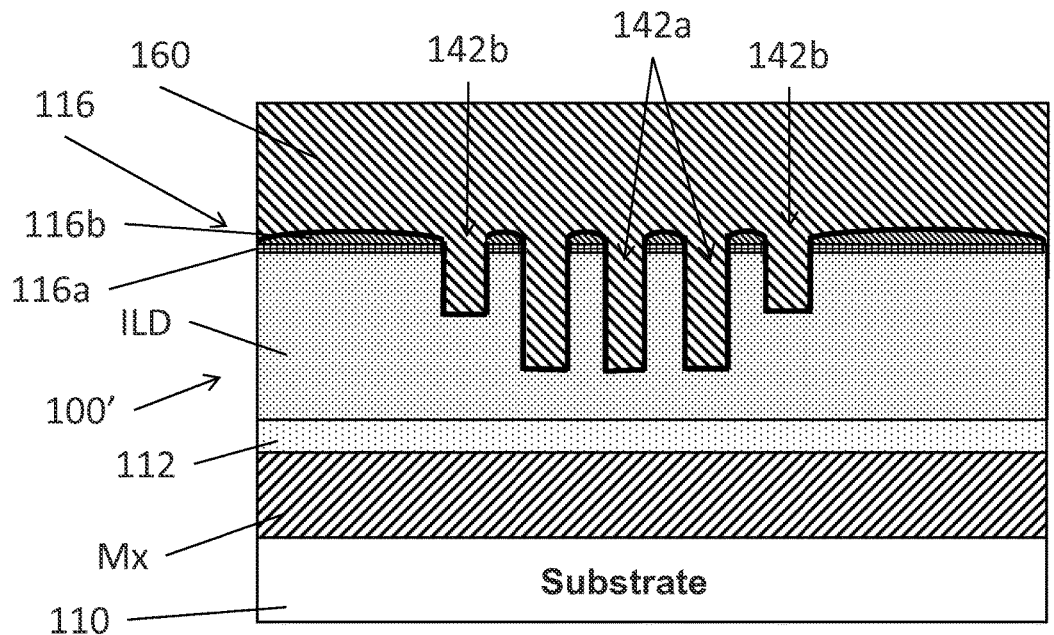
Figure 3Q:
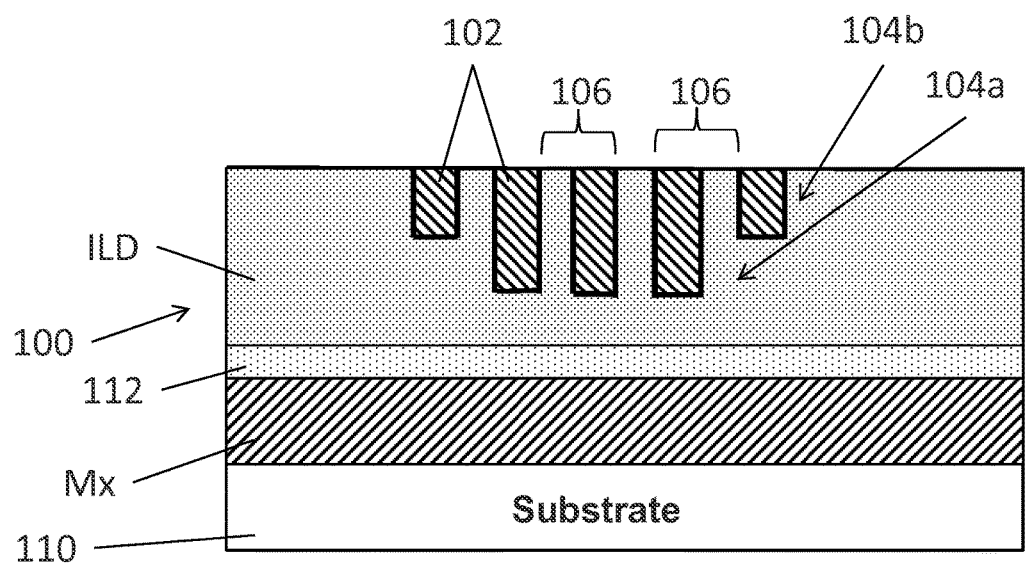

Reference is now made to FIGS. 3A-3Q which illustrate process steps for forming the structure of FIG. 2.

Standard integrated circuit processing techniques well known to those skilled in the art are used to form the wafer structure 110' shown in FIG. 3A which includes the substrate 110 resulting from FEOL processing, and a metallization layer Mx (x=1 to n, n being an integer and n having values upwards of 6 or 7 for some integrated circuits using many metallization layers), dielectric (NBLoK) cap layer 112 and interlevel dielectric layer ILD resulting from BEOL processing.

The metallization layer Mx may comprise a first metallization layer M1 (see, FIG. 2) in a preferred implementation, but could comprise any metallization layer of the integrated circuit being formed. The metallization layer Mx is typically made of copper and may have a thickness of about 50 nm. Although not shown explicitly, it is understood by those skilled in the art that the metal of metallization layer Mx is patterned to form lines, the illustration showing one such line extending in a left-right direction, with the lines surrounded by a insulating dielectric material (not shown). Electrical connection is made by the metallization layer Mx to the underlying substrate 110.

The dielectric (NBLoK) cap layer 112 may, for example, have a thickness of about 20 nm.

The interlevel dielectric layer ILD may, for example, have a thickness of about 100 nm. The ILD layer may comprise a high k material such a silicon dioxide. It is preferred, however, to use a low k dielectric material (k<4.0) and several suitable materials such as low k SiCOH and ultra-low k porous pSiCOH are known to those skilled in the art. A preferred material is porogenless OMCATS+UV cure material (having a k=2.55).

The wafer 110' structure further includes a hard mask 116. The hard mask 116 may be formed of a plurality of hard mask layers including: an octamethylcyclotetrasiloxane (OMCTS) hard mask layer 116a; a tetraethyl orthosilicate (TEOS) oxide hard mask layer 116b; and a titanium nitride (TiN) metal hard mask layer 116c. The OMCTS hard mask layer 116a may have a thickness of about 5 nm. The TEOS oxide hard mask layer 116b may have a thickness of about 15 nm. The TiN metal hard mask layer 116c may have a thickness of about 25 nm.

Figure 1A:
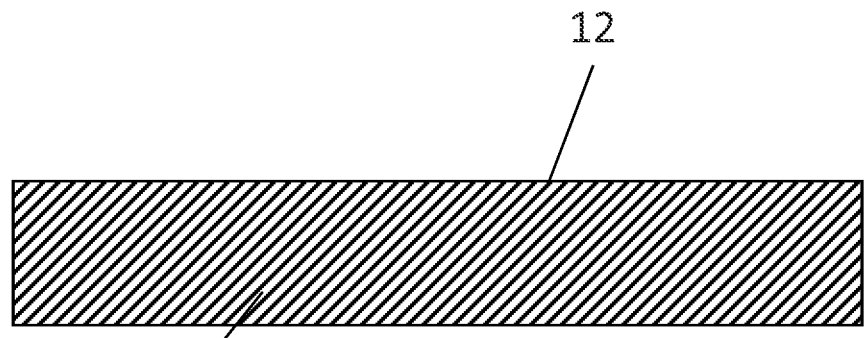
FIGS. 1A-1E illustrate process steps for a sidewall image transfer process known in the art.
Figure 1B:
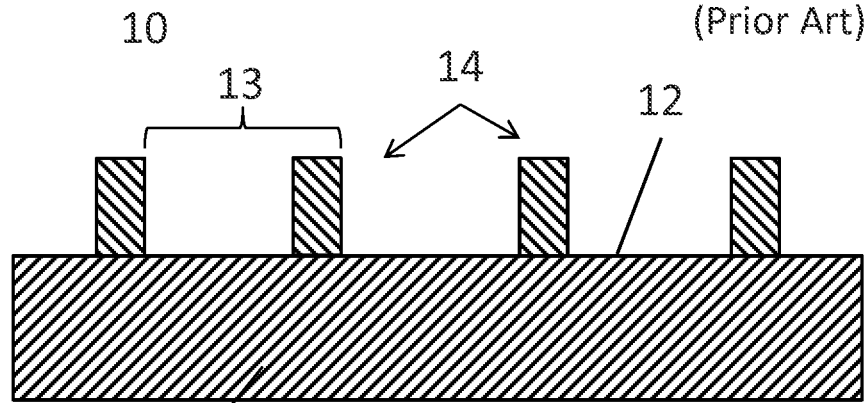
Figure 1C:
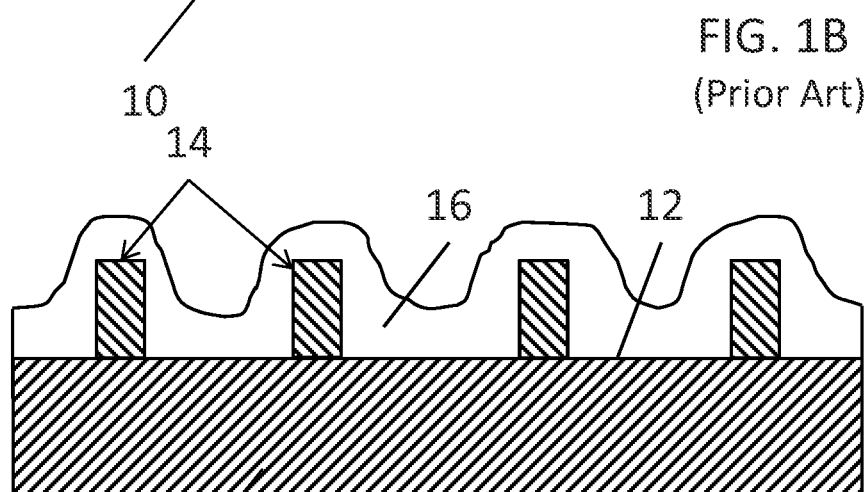
Figure 1D:
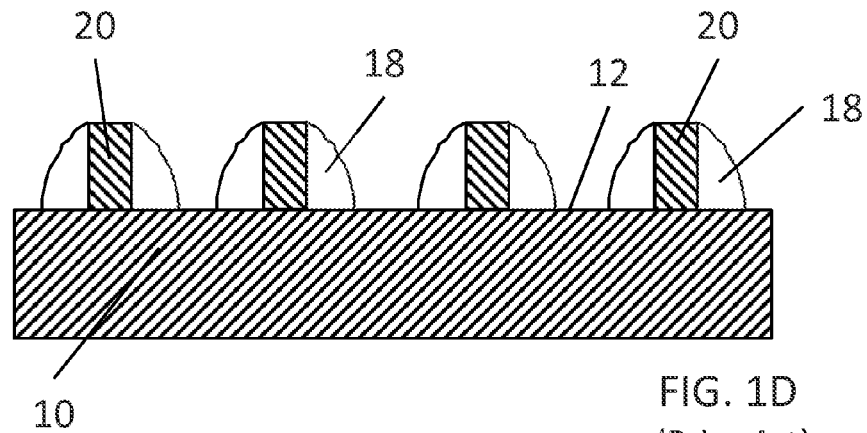
Figure 1E:
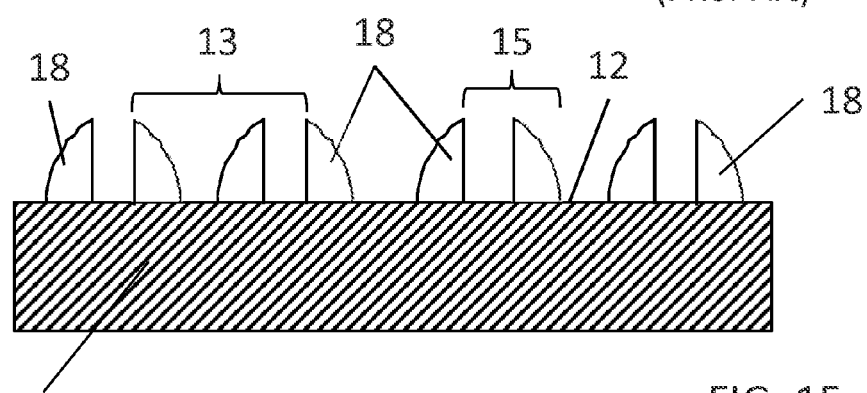

The BEOL processing continues as shown in FIG. 3B to use the sidewall image transfer (SIT) process (see, FIGS. 1A-1E) to form a plurality of oxide spacer lines 118. The spacer lines 118 exhibit a pitch 15 which is a sub-lithographic pitch with respect to the pitch 13 of the lithographically produced structure (see FIG. 1B). Those spacer lines 118 are subsequently covered by a dielectric layer 120 having a planar top surface 121. The dielectric layer 120 may have a thickness of about 100 nm, and thus the oxide spacer lines have a height of about 75 nm. The dielectric layer 120 is formed of silicon dioxide, for example, although other dielectric material could instead be used. The dielectric layer 120 is preferably conformally deposited as known to those skilled in the art, and thus a chemical mechanical planarization (CMP) process is performed to provide the planar top surface 121.

Reference is now made to FIG. 3C. An antireflective coating (ARC) layer 122 is then deposited over planar top surface 121 of the dielectric layer 120. The ARC layer 122 may have a thickness of about 35-100 nm and comprise SNB-A940 (available, for example, from Shin-Etsu Chemical Co., Ltd.) deposited by a coating process as known in the art.

A patterned resist image 124 is then formed on the top surface of the ARC layer 122. Any suitable resist material patterned using conventional lithographic techniques may be used. The patterned resist image 124 includes an opening 126a which exposes a top surface 123 of the ARC layer 122.

A reactive ion etch (RIE) is then used to directionally etch the ARC layer 122 through the opening 126a to define an opening 126b which extends through the ARC layer 122 and stops on the top surface 121 of the dielectric layer 120. The result of this etch is shown in FIG. 3D.

The patterned resist image 124 is then removed as shown in FIG. 3E.

A conformal dielectric layer 130 is then deposited over the wafer 110'. The layer may comprise, for example, an oxide layer such as silicon dioxide having a thickness of about 35-100 nm. The result is shown in FIG. 3F.

A highly directional etch, such as an RIE, is then used to remove the planar areas of the layer 130 so as to leave sidewalls (also referred to as collars) 132 on either side of the ARC structures 134 formed from the ARC layer 122. This defines an opening 126c between the sidewalls 132 exposing a top surface of the dielectric layer 120. The result is shown in FIG. 3G. It is important to note that the thicknesses of the ARC layer 122 and the conformal dielectric layer 130 can be selected (for example, within the exemplary range of 35-100 nm) so as to control, as a result of the directional etch, the lateral size of the opening 126c. For example, through proper selection of thicknesses the opening 126c may be substantially aligned with underlying structures of the wafer 110' such as the oxide spacer lines 118.

A further highly direction etch, again such as an RIE, is performed through the opening 126c to remove portions of the dielectric layer 120. The etch stops within the hard mask 116 (and more particularly stops within the titanium nitride (TiN) metal hard mask layer 116c). The result of this etch on the wafer 110' as shown in FIG. 3H is to form an opening 126d in the dielectric layer 120. Within the opening 126d, certain ones of the oxide spacer lines 118a are exposed.

An etch is then performed to remove the sidewalls 132. The etch may comprise, for example, an RIE. This defines an opening 126e between the ARC structures 134 and extending into the dielectric layer 120 (which in effect enlarges the opening 126c that was previously formed). The result of this etch on the wafer 110' is shown in FIG. 3I.

A further highly direction etch, again such as an RIE, is performed through the opening 126d to remove additional portions of the dielectric layer 120. The etch stops within the hard mask 116 (and more particularly stops within the titanium nitride (TiN) metal hard mask layer 116c and the tetraethyl orthosilicate (TEOS) oxide hard mask layer 116b). The result of this etch as shown in FIG. 3J is to form an opening 126f (which in effect enlarges the opening 126d that was previously formed). Within the opening 126f, additional oxide spacer lines 118b are now exposed. This etch acts on the hard mask 116 that was previously exposed through opening 126d and results in a deeper etch penetration into the tetraethyl orthosilicate (TEOS) oxide hard mask layer 116b in the area of the wafer 110' associated with the previously exposed oxide spacer lines 118a. The further etch also causes a reduction in the height of those oxide spacer lines 118a.

An etch is then performed to remove the dielectric layer 120. The etch may comprise, for example, an RIE. The result of this etch is shown in FIG. 3K.

As a result of the foregoing process, the hard mask 116 now includes a plurality of openings 140a and 140b. The openings 140a have a depth extending completely through the titanium nitride (TiN) metal hard mask layer 116c and stopping within the tetraethyl orthosilicate (TEOS) oxide hard mask layer 116b. The openings 140b have a depth extending into and stopping within the titanium nitride (TiN) metal hard mask layer 116c. The patterned hard mask structure defines an etching mask 146 to be used for forming trenches in the underlying interlevel dielectric layer ILD of the wafer 110'. In this context, the openings 140a and 140b have a length (extending into and out of the FIG. 3K illustration) which is greater than a width (as shown in the FIG. 3K illustration).

A trench etch is then performed through the openings 140a and 140b in the etching mask 146 to form a plurality of trenches 142a and 142b which extend through all the layers of the hard mask 116 and into the interlevel dielectric layer ILD. The trench etch is highly directional, and may comprise an RIE. The trenches 142a each have a depth (of approximately 56 nm) extending into the layer IDL which is deeper than the depth (of approximately 28 nm) of the trenches 142b. The result of the trench etch process is shown in FIG. 3L. It will be noted that the trench etch also removes the oxide spacer lines 118. It will be understood that alternatively a separate etch may be performed to remove the oxide spacer lines 118a followed by the trench etch to form the trenches 142a and 142b. In this context, the trenches 142a and 142b have a length (extending into and out of the FIG. 3L illustration) which is greater than a width (as shown in the FIG. 3L illustration).

A wet etch is then performed to remove the titanium nitride (TiN) metal hard mask layer 116c. The result of this etch is shown in FIG. 3M.

The corners of the tetraethyl orthosilicate (TEOS) oxide hard mask layer 116b are then rounded using an isotropic dry or wet etch as known in the art. The result of this etch is shown in FIG. 3N. The rounded TEOS oxide hard mask layer 116b has thickness of about 5 nm. Rounding of the corners promotes better metal fill of the trenches 142a and 142b. It will be understood that rounding is an optional step.

A metal liner 150 is then deposited on the exposed surfaces of the wafer 110' so as to cover the rounded tetraethyl orthosilicate (TEOS) oxide hard mask layer 116b as well as the sidewalls and floor of the trenches 142a and 142b. The liner 150 may comprise, for example, tantalum (Ta) and/or tantalum nitride (TaN). The liner 150 is deposited using conventional chemical vapor deposition (CVD) or plasma enhanced CVD (PECVD) processes known to those skilled in the art. The liner 150 may be 4-8 nm in thickness. The result is shown in FIG. 3O.

Reference is now made to FIG. 3P which shows the formation of a metal material 160 over the wafer 110' and filling the lined trenches 142a and 142b. The metal material 160 may be deposited, for example, through a plating process as known to those skilled in the art. The metal material 160 preferably comprises copper.

A chemical mechanical polishing (CMP) process is then performed to remove the overlying portions of the metal material 160 and the remainder of the hard mask 116. The polishing operation stops at (or slightly within) the interlevel dielectric layer ILD. As a result, separate interconnection lines 102 are formed by the metal material 160 filling within each of the lined trenches 142a and 142b. Because the interconnection lines 102 have different depths, the lines will exhibit different resistivities. For example, the interconnection lines 102 formed in the deeper trenches 142a will provide a lower resistivity connection through low resistivity lines 104a. The interconnection lines 102 formed in the shallower trenches 142b will provide a higher resistivity connection through high resistivity lines 104b. Notwithstanding the difference in resistivity, it will be noted that the pitch 106 between interconnection lines 102 remains substantially equal (and in a preferred embodiment, within the limits of the fabrication process, the pitches are equal or identical). Furthermore, in a preferred embodiment, the pitch 106 is a sub-lithographic pitch (compare to pitch 15, FIG. 3B.) Forming interconnection lines 102 with different resistivities but having the same pitch is advantageous to fabricating integrated circuits with smaller interconnection areas and higher densities. This structure accordingly supports satisfaction of scaling requirements for integrated circuit designs at smaller processing nodes.

FIGS. 3A-3Q thus present a novel method to form trenches of different depths (also referred to herein as hybrid depth trenches) having a substantially equal or identical pitch. In this context, the pitches are substantially equal if within 3% of each other. Advantageously, the method does not require the use of an extra (additional) hard mask. Rather, a sidewall image transfer (SIT) technique is used to pattern a single hard mask structure to include openings having different depth but having a same pitch. A subsequent directional etch performed through the openings results in the formation of trenches defining line locations in an underlying structure, such as an interlevel dielectric (ILD) layer, that have different depths but with that same pitch.

Filling those trenches with metal material forms interconnection lines in the ILD layer that have different depths but that same pitch, the difference in depth of the metal filled trenches causing the interconnection lines to exhibit different resistivities. Lines with a deeper depth are provided for connection to devices and components of the integrated circuit which need a low resistivity interconnection. Lines with a shallower depth are provided for connection to devices and components of the integrated circuit which need a high resistivity interconnection. The provision of different depths for the openings in the hard mask is controlled by selection of material thicknesses, and thus this selection will also control the resistivity of the formed interconnection lines.

Figure 4:
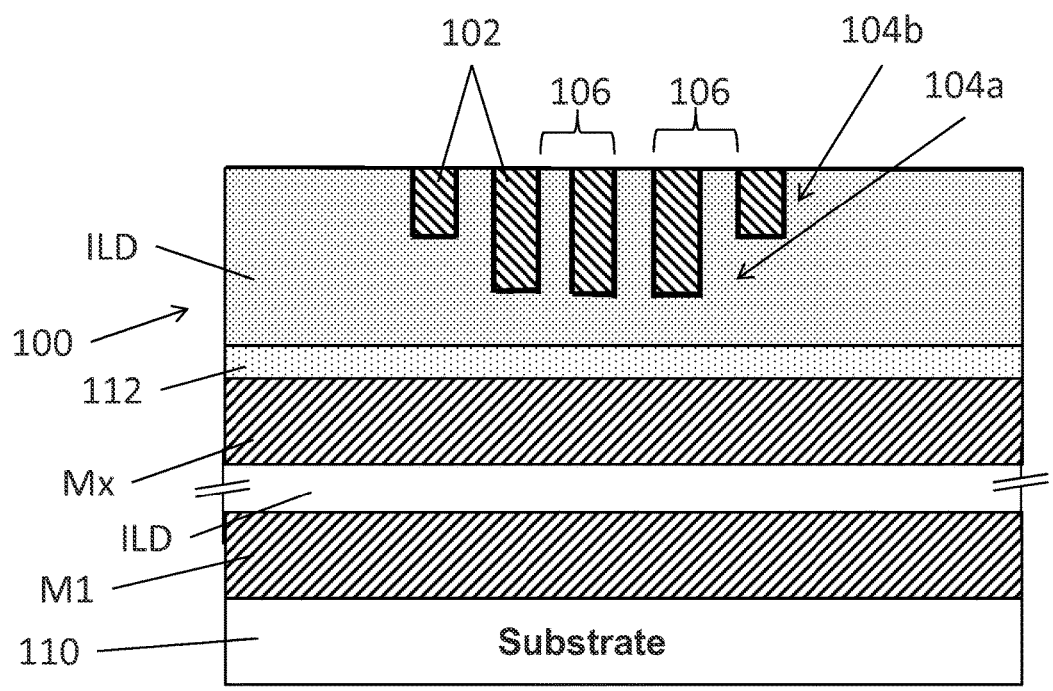
FIG. 4 is a cross-section of an integrated circuit formed by the process of FIGS. 3A-3Q with interconnection lines having different resistivities and a constant line pitch located at an upper metallization layer.

FIG. 4 is a cross-section of an integrated circuit formed by the process of FIGS. 3A-3Q with interconnection lines having different resistivities and a constant line pitch located at an upper metallization layer. It is accordingly clear that the process is not limited to the formation of interconnection lines in the ILD layer immediately above the first metallization layer M1, but rather the process is applicable for use in any ILD layer above any metallization layer Mx.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
forming an interlevel dielectric layer over a substrate;
forming a hard mask on a top planar surface of the interlevel dielectric layer;
forming openings in the hard mask including a first plurality of openings having a first depth which does not extend through the hard mask and a second plurality of openings having a second depth which does not extend through the hard mask but which is smaller than the first depth;
performing a directional etch simultaneously through the first and second pluralities of openings in the hard mask to etch through the hard mask and into the interlevel dielectric layer so as to form first and second pluralities of trenches, wherein the first plurality of trenches has a first trench depth and the second plurality of trenches has a second trench depth which is smaller than the first trench depth; and
filling the first and second pluralities of trenches with a metal material to form first and second interconnection lines having a substantially equal pitch;
wherein said substantially equal pitch is a sub-lithographic pitch.

2. The method of claim 1, further comprising: lining the first and second pluralities of trenches with a metal liner before filling the first and second pluralities of trenches with the metal material.

3. The method of claim 1, further comprising: removing the hard mask after filling the first and second pluralities of trenches with the metal material.

4. The method of claim 1, further comprising: forming a first metallization layer over the substrate and under the interlevel dielectric layer.

5. The method of claim 1, further comprising: rounding corners of the hard mask at locations of the first and second pluralities of openings in the hard mask before filling the first and second pluralities of trenches with the metal material.

6. The method of claim 1, wherein forming the hard mask comprises:
depositing a first mask layer on the top planar surface of the interlevel dielectric layer;
depositing a second mask layer on the first mask layer; and
depositing a third mask layer on the second mask layer.

7. The method of claim 6, wherein first depth of the first plurality of openings extends through the third mask layer and into, but not through, the second mask layer, and wherein the second depth of the second plurality of openings extends into, but not through, the third mask layer.

8. The method of claim 6, further comprising:
removing the third mask layer before filling the first and second pluralities of trenches with the metal material; and
rounding corners of the second hard mask at locations of the first and second pluralities of openings before filling the first and second pluralities of trenches with the metal material.

9. A method, comprising:
forming an interlevel dielectric layer over a substrate;
forming a hard mask on a top planar surface of the interlevel dielectric layer;
forming openings in the hard mask including a first plurality of openings having a first depth which does not extend through the hard mask and a second plurality of openings having a second depth which does not extend through the hard mask but which is smaller than the first depth;
performing a directional etch simultaneously through the first and second pluralities of openings in the hard mask to etch through the hard mask and into the interlevel dielectric layer so as to form first and second pluralities of trenches, wherein the first plurality of trenches has a first trench depth and the second plurality of trenches has a second trench depth which is smaller than the first trench depth; and
filling the first and second pluralities of trenches with a metal material to form first and second interconnection lines having a substantially equal pitch;
wherein forming openings in the hard mask comprises:
using a sidewall image transfer process to define a plurality of spacer lines on a top surface of the hard mask, said spacer lines having said substantially equal pitch;
covering the spacer lines with a material;
forming a first opening in a mask placed over the material;
etching the material through the first opening to expose a first plurality of said spacer lines, said etching continuing through openings between the first plurality of said spacer lines to etch the hard mask and form the first plurality of openings in the hard mask having the first depth;
forming a second opening in said mask; and
etching the material through the second opening to expose a second plurality of said spacer lines, said etching continuing through openings between the second plurality of said spacer lines to etch the hard mask and form the second plurality of openings in the hard mask having the second depth.

10. The method of claim 9, wherein forming the second opening comprises enlarging the first opening to form said second opening.

11. A method, comprising:
forming an interlevel dielectric layer over a substrate;
forming a hard mask on a top planar surface of the interlevel dielectric layer;
forming openings in the hard mask including a first plurality of openings having a first depth which does not extend through the hard mask and a second plurality of openings having a second depth which does not extend through the hard mask but which is smaller than the first depth;
performing a directional etch simultaneously through the first and second pluralities of openings in the hard mask to etch through the hard mask and into the interlevel dielectric layer so as to form first and second pluralities of trenches, wherein the first plurality of trenches has a first trench depth and the second plurality of trenches has a second trench depth which is smaller than the first trench depth; and
filling the first and second pluralities of trenches with a metal material to form first and second interconnection lines having a substantially equal pitch;
wherein forming openings in the hard mask comprises:
using a sidewall image transfer process to define a plurality of spacer lines on a top surface of the hard mask, said spacer lines having said substantially equal pitch;
using a first plurality of said spacer lines as an etching mask to form the first plurality of openings in the hard mask having the first depth; and
using a second plurality of said spacer lines as an etching mask to form the second plurality of openings in the hard mask having the second depth.

12. The method of claim 11, wherein said sidewall image transfer process defines the plurality of spacer lines from a structure having a lithographic limited pitch, and wherein said substantially equal pitch is a sub-lithographic pitch.

13. A method, comprising:
forming a hard mask on a dielectric layer;
using a sidewall image transfer process to define a plurality of spacer lines on the hard mask, said spacer lines having said substantially equal pitch;
covering the spacer lines with a material;
forming a first opening in a mask;
etching the material through the first opening to expose a first plurality of said spacer lines, said etching continuing through openings between the first plurality of said spacer lines to etch the hard mask and form a first plurality of openings in the hard mask having a first depth;
forming a second opening in the mask;
etching the material through the second opening to expose a second plurality of said spacer lines, said etching continuing through openings between the second plurality of said spacer lines to etch the hard mask and form a second plurality of openings in the hard mask having a second depth;
performing a directional etch simultaneously through the first and second pluralities of openings in the hard mask to etch into the dielectric layer so as to form first and second pluralities of trenches, wherein the first plurality of trenches has a first trench depth and the second plurality of trenches has a second trench depth which is smaller than the first trench depth; and
filling the first and second pluralities of trenches with a metal material to form first and second interconnection lines in the dielectric layer having a substantially equal pitch.

14. The method of claim 13, further comprising: lining the first and second pluralities of trenches with a metal liner before filling the first and second pluralities of trenches with the metal material.

15. The method of claim 13, wherein forming the second opening comprises enlarging the first opening to form said second opening.

16. The method of claim 13, wherein said sidewall image transfer process defines the plurality of spacer lines from a structure having a lithographic limited pitch, and wherein said substantially equal pitch is a sub-lithographic pitch.

17. The method of claim 13, wherein said substantially equal pitch is a sub-lithographic pitch.

18. The method of claim 13, further comprising: rounding corners of the hard mask at locations of the first and second pluralities of openings in the hard mask before filling the first and second pluralities of trenches with the metal material.

19. A method, comprising:
forming an interlevel dielectric layer over a substrate;
forming a first plurality of trenches having a first depth in the interlevel dielectric layer;
forming a second plurality of trenches having a second depth in the interlevel dielectric layer; and
depositing a metal material filling both the first plurality of trenches and the second plurality of trenches so as to form first interconnection lines within the first plurality of trenches and second interconnection lines within the second plurality of trenches;
wherein the first and second interconnection lines have a substantially equal pitch;
wherein said substantially equal pitch is a sub-lithographic pitch.

20. The method of claim 19, further comprising performing a directional etch simultaneously through the first and second pluralities of openings in the hard mask to etch through the hard mask and into the interlevel dielectric layer so as to form the first and second pluralities of trenches.

21. The method of claim 20, further comprising: removing the hard mask after filling the first and second pluralities of trenches with the metal material.

22. The method of claim 20, wherein forming openings in the hard mask comprises:
using a sidewall image transfer process to define a plurality of spacer lines on a top surface of the hard mask, said spacer lines having said substantially equal pitch;
using a first plurality of said spacer lines as an etching mask to form the first plurality of openings in the hard mask having the first depth; and
using a second plurality of said spacer lines as an etching mask to form the second plurality of openings in the hard mask having the second depth.

23. The method of claim 19, wherein said sidewall image transfer process defines the plurality of spacer lines from a structure having a lithographic limited pitch, and wherein said substantially equal pitch is a sub-lithographic pitch.

* * * * *